US012681064B2

(12) United States Patent
Chang et al.

(10) Patent No.: US 12,681,064 B2
(45) Date of Patent: Jul. 14, 2026

(54) METHOD FOR OBTAINING THE DIELECTRIC CONSTANT OF A DIELECTRIC SHEET

(71) Applicant: MSSCORPS CO., LTD., Hsinchu City (TW)

(72) Inventors: Mao-Nan Chang, Taichung City (TW); Chi-Lun Liu, Hsinchu City (TW); Hsueh-Liang Chou, Hsinchu City (TW); Wei-Chih Hsiao, Chiayi City (TW); Chun-Ting Wu, Pingtung County (TW)

(73) Assignee: Msscorps Co., Ltd., Hsinchu City (TW)

( * ) Notice: Subject to any disclaimer, the term of this patent is extended or adjusted under 35 U.S.C. 154(b) by 160 days.

(21) Appl. No.: 18/671,030

(22) Filed: May 22, 2024

(65) Prior Publication Data

US 2025/0341555 A1      Nov. 6, 2025

(30) Foreign Application Priority Data

May 3, 2024    (TW) .................................. 113116487

(51) Int. Cl.
G01R 27/26           (2006.01)
G01Q 60/46           (2010.01)
          (Continued)

(52) U.S. Cl.
CPC ......... G01R 27/2617 (2013.01); G01Q 60/46 (2013.01); G01R 27/26 (2013.01);
          (Continued)

(58) Field of Classification Search
CPC ....................... G01R 27/2617; G01R 31/2639; G01R 27/26; G01R 27/2605; G01Q 60/46;
          (Continued)

(56) References Cited

U.S. PATENT DOCUMENTS

2006/0250150 A1*  11/2006  Tunaboylu ......... G01R 1/07378
                                                           324/756.03
2009/0084952 A1*   4/2009  Rutgers .................. G01Q 60/48
                                                           250/307
                    (Continued)

FOREIGN PATENT DOCUMENTS

TW           202316075 A       4/2023

OTHER PUBLICATIONS

TW 202316075 supplemental machine translation, Apr. 16, 2023 (Year: 2023).*

(Continued)

*Primary Examiner* — Raul J Rios Russo
(74) *Attorney, Agent, or Firm* — Rosenberg, Klein & Lee

(57)           ABSTRACT

In a method for obtaining the dielectric constant of a dielectric sheet, a modulation voltage is applied to a semiconductor capacitor and a first parallel plate capacitor to measure a first scanning capacitance microscopy signal. Then, the first parallel plate capacitor is replaced with a second parallel plate capacitor to measure a second scanning capacitance microscopy signal corresponding to the semiconductor capacitor and the second parallel plate capacitor. Finally, the second parallel plate capacitor is replaced with a third parallel plate capacitor to measure a third scanning capacitance microscopy signal corresponding to the semiconductor capacitor and the third parallel plate capacitor. Based on the scanning capacitance microscopy signals and dielectric constants and the equivalent physical thicknesses of the dielectric sheets of the first parallel plate capacitor and second parallel plate capacitor, the dielectric constant of the dielectric sheet of the third parallel plate capacitor is obtained.

7 Claims, 7 Drawing Sheets

(51) Int. Cl.
    *G01R 31/26*         (2020.01)
    *G06F 3/044*         (2006.01)

(52) U.S. Cl.
    CPC ..... *G01R 27/2605* (2013.01); *G01R 31/2639*
        (2013.01); *G06F 3/044* (2013.01); *G06F*
        *3/0441* (2019.05); *G06F 3/0442* (2019.05);
        *G06F 3/0443* (2019.05); *G06F 3/0444*
        (2019.05); *G06F 3/0445* (2019.05); *G06F*
        *3/0446* (2019.05); *G06F 3/0447* (2019.05);
        *G06F 3/0448* (2019.05)

(58) Field of Classification Search
    CPC ...... G06F 3/044; G06F 3/0441; G06F 3/0442;
        G06F 3/0443; G06F 3/0445; G06F
        3/0444; G06F 3/0446; G06F 3/0447;
        G06F 3/0448
    USPC ....................................................... 324/658
    See application file for complete search history.

(56) References Cited

U.S. PATENT DOCUMENTS

| | | | |
|---|---|---|---|
| 2010/0295560 A1* | 11/2010 | Tran | G01Q 60/30 324/661 |
| 2012/0137396 A1* | 5/2012 | Rogers | G01N 23/225 850/26 |
| 2017/0299525 A1* | 10/2017 | Cui | G01Q 10/045 |
| 2021/0066035 A1* | 3/2021 | Trimpl | H01J 37/3177 |

OTHER PUBLICATIONS

Search Report mailed to corresponding European Patent Application dated Nov. 8, 2024 for Application No. 24175805.1.

* cited by examiner

METHOD FOR OBTAINING THE DIELECTRIC CONSTANT OF A DIELECTRIC SHEET

BACKGROUND OF THE INVENTION

This application claims priority for the TW patent application No. 113116487 filed on 3 May 2024, the content of which is incorporated by reference in its entirely.

FIELD OF THE INVENTION

The present invention relates to a method for obtaining a dielectric constant, particularly to a method for obtaining the dielectric constant of a dielectric sheet.

DESCRIPTION OF THE RELATED ART

Scanning capacitance microscopy (SCM) has developed many applications in the analysis of semiconductor materials and components. The most important application is the analysis of electrical properties of metal-oxide-semiconductor field effect transistors (MOSFETs), such as observing the two-dimensional carrier concentration distribution and pn junction images.

However, scanning capacitance microscopy is unable to measure the dielectric constant of any dielectric sheet. The dielectric constant is typically measured by an experimental technique known as the dielectric resonance method. In this method, the test sample is placed into the experimental device under an electromagnetic field. As the electromagnetic field varies, the sample resonates. In other words, the sample absorbs more energy at a specific frequency. By measuring the resonance frequency, the electromagnetic response characteristics of the sample can be obtained. Based on the sample's resonant frequency and the characteristics of the experimental device, the dielectric constant of the sample can be calculated based on corresponding formulas. However, measurement results may be influenced by the shape of the sample. The geometric shape of the specific sample may introduce errors.

To overcome the abovementioned problems, the present invention provides a method for obtaining the dielectric constant of a dielectric sheet, so as to solve the aforementioned problems of the prior art.

SUMMARY OF THE INVENTION

The present invention provides a method for obtaining the dielectric constant of a dielectric sheet, which calculates the dielectric constant of the dielectric sheet of a parallel plate capacitor to be measured, thereby solving the problem with measurement errors caused by changes in the shape of the dielectric sheet due to undulations on the surface of the material or internal voids. The method extends the scanning capacitance microscopy to the field of measuring the dielectric constant of dielectric sheets to enhance the capabilities of scanning capacitance microscopy in the related applications.

In an embodiment of the present invention, a method for obtaining the dielectric constant of a dielectric sheet includes: connecting a semiconductor capacitor and a first parallel plate capacitor in series, wherein a first dielectric sheet of the first parallel plate capacitor has a known first equivalent physical thickness d1 and a known first dielectric constant $\varepsilon 1$ and the semiconductor capacitor has a depletion region; by a scanning capacitance microscopy, applying a modulation voltage to the semiconductor capacitor and the first parallel plate capacitor to periodically change a width of the depletion region and measuring a first scanning capacitance microscopy signal corresponding to the semiconductor capacitor and the first parallel plate capacitor; replacing the first parallel plate capacitor with a second parallel plate capacitor and connecting the semiconductor capacitor and the second parallel plate capacitor in series, wherein a second dielectric sheet of the second parallel plate capacitor has a known second equivalent physical thickness d2 and a known second dielectric constant $\varepsilon 2$; by the scanning capacitance microscopy, applying the modulation voltage to the semiconductor capacitor and the second parallel plate capacitor to periodically change a width of the depletion region and measuring a second scanning capacitance microscopy signal corresponding to the semiconductor capacitor and the second parallel plate capacitor; calculating an impedance ratio based on the first scanning capacitance microscopy signal, the second scanning capacitance microscopy signal, and $(d2/d1) \times (\varepsilon 1/\varepsilon 2)$; replacing the second parallel plate capacitor with a third parallel plate capacitor and connecting the semiconductor capacitor and the third parallel plate capacitor in series, wherein a third dielectric sheet of the third parallel plate capacitor has a known third equivalent physical thickness d3 and the first dielectric sheet, the second dielectric sheet, and the third dielectric sheet have the same areas; by the scanning capacitance microscopy, applying the modulation voltage to the semiconductor capacitor and the third parallel plate capacitor to periodically change a width of the depletion region and measuring a third scanning capacitance microscopy signal corresponding to the semiconductor capacitor and the third parallel plate capacitor; and obtaining a third dielectric constant of the third dielectric sheet of the third parallel plate capacitor based on the first scanning capacitance microscopy signal, the third scanning capacitance microscopy signal, the third equivalent physical thickness, and the impedance ratio.

In an embodiment of the present invention, the semiconductor capacitor is a metal-oxide-semiconductor capacitor.

In an embodiment of the present invention, the semiconductor capacitor further includes a conductive probe that is electrically grounded.

In an embodiment of the present invention, the first dielectric sheet, the second dielectric sheet, and the third dielectric sheet include an insulating material.

In an embodiment of the present invention, the first scanning capacitance microscopy signal, the second scanning capacitance microscopy signal, the first equivalent physical thickness, the second equivalent physical thickness, and the impedance ratio meet a following equation: $S1/S2 = ZR \times (d2/d1) \times (\varepsilon 1/\varepsilon 2) + (1 - ZR)$, where S1 represents the first scanning capacitance microscopy signal, S2 represents the second scanning capacitance microscopy signal, and ZR represent the impedance ratio.

In an embodiment of the present invention, the first scanning capacitance microscopy signal, the third scanning capacitance microscopy signal, the first equivalent physical thickness, the third equivalent physical thickness, and the impedance ratio meet a following equation: $S1/S3 = ZR \times (d3/d1) \times (\varepsilon 1/\varepsilon 3) + (1 - ZR)$, where S1 represents the first scanning capacitance microscopy signal, S3 represents the third scanning capacitance microscopy signal, ZR represent the impedance ratio, and $\varepsilon 3$ represents the third dielectric constant.

In an embodiment of the present invention, the impedance ratio=an impedance corresponding to the first dielectric sheet divided by (an impedance corresponding to the semi-conductor capacitor+the impedance corresponding to the first dielectric sheet).

To sum up, the method for obtaining the dielectric constant of a dielectric sheet employs the three known equivalent physical thicknesses and the impedance ratio to calculate the dielectric constant of the dielectric sheet of the parallel plate capacitor to be measured, thereby solving the problem with measurement errors caused by changes in the shape of the dielectric sheet due to undulations on the surface of the material or internal voids. The method extends the scanning capacitance microscopy to the field of measuring the dielectric constant of dielectric sheets to enhance the capabilities of scanning capacitance microscopy in the related applications.

Below, the embodiments are described in detail in cooperation with the drawings to make easily understood the technical contents, characteristics and accomplishments of the present invention.

DETAILED DESCRIPTION OF THE INVENTION

Figure 1A:
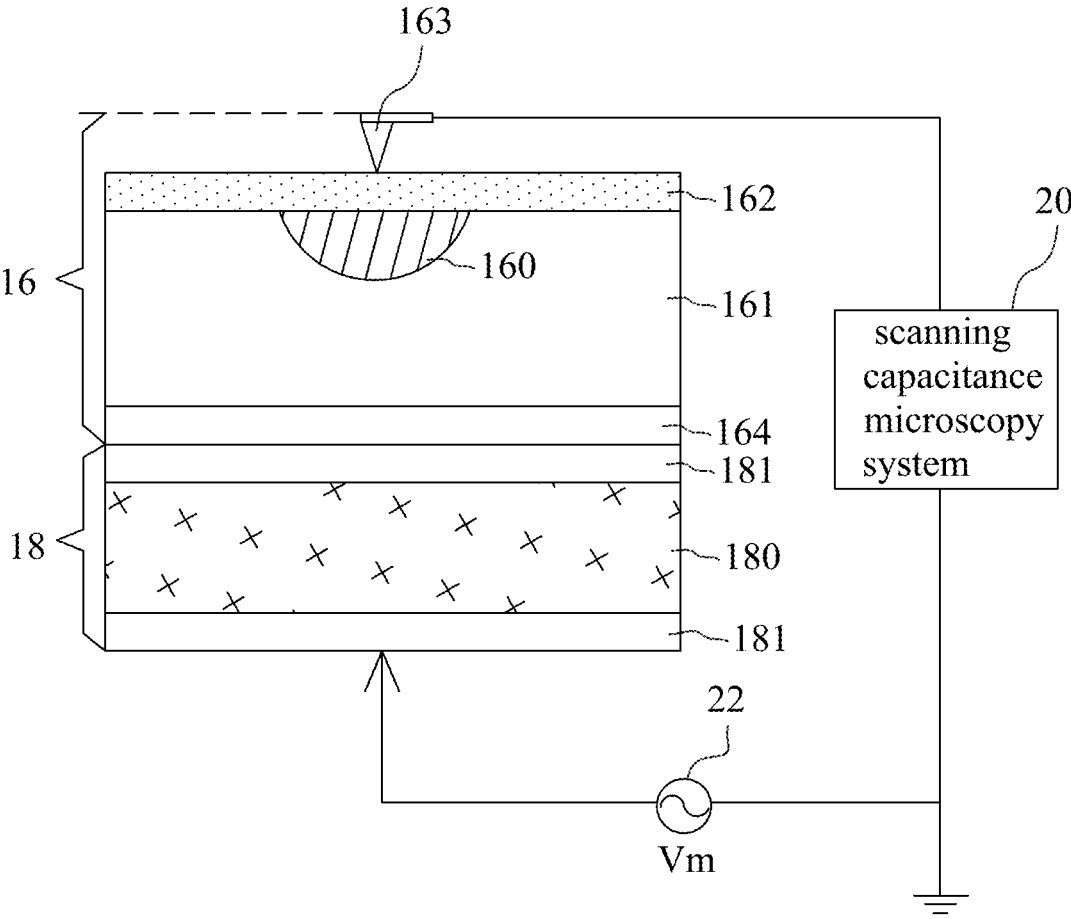
FIGS. 1(a)-1(c) are schematic diagrams illustrating the steps of a method for obtaining the dielectric constant of a dielectric sheet according to an embodiment of the present invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatings and modifications will be apparent to those skilled in the art, once informed by the present disclosure.

When an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the articles "a" and "the" includes the meaning of "one or at least one" of the elements or components. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. The examples in the present specification do not limit the claimed scope of the invention.

Furthermore, it can be understood that the terms "comprising," "including," "having," "containing," and "involving" are open-ended terms, which refer to "may include but is not limited to so." In addition, each of the embodiments or claims of the present invention is not necessary to achieve all the effects and advantages possibly to be generated, and the abstract and title of the present invention is used to assist for patent search and is not used to further limit the claimed scope of the present invention.

Further, in the present specification and claims, the term "comprising" is open type and should not be viewed as the term "consisted of." In addition, the term "electrically coupled" can be referring to either directly connecting or indirectly connecting between elements. Thus, if it is described in the below contents of the present invention that a first device is electrically coupled to a second device, the first device can be directly connected to the second device, or indirectly connected to the second device through other devices or means. Moreover, when the transmissions or generations of electrical signals are mentioned, one skilled in the art should understand some degradations or undesirable transformations could be generated during the operations. If it is not specified in the specification, an electrical signal at the transmitting end should be viewed as substantially the same signal as that at the receiving end. For example, when the end A of an electrical circuit provides an electrical signal S to the end B of the electrical circuit, the voltage of the electrical signal S may drop due to passing through the source and drain of a transistor or due to some parasitic capacitance. However, the transistor is not deliberately used to generate the effect of degrading the signal to achieve some result, that is, the signal S at the end A should be viewed as substantially the same as that at the end B.

Unless otherwise specified, some conditional sentences or words, such as "can", "could", "might", or "may", usually attempt to express what the embodiment in the invention has, but it can also be interpreted as a feature, element, or step that may not be needed. In other embodiments, these features, elements, or steps may not be required.

In the following description, a method for obtaining the dielectric constant of a dielectric sheet employs three known equivalent physical thicknesses and an impedance ratio to calculate the dielectric constant of the dielectric sheet of a parallel plate capacitor to be measured, thereby solving the problem with measurement errors caused by changes in the shape of the dielectric sheet due to undulations on the surface of the material or internal voids. The method extends the scanning capacitance microscopy to the field of measuring the dielectric constant of dielectric sheets to enhance the capabilities of scanning capacitance microscopy in the related applications.

Figure 1B:
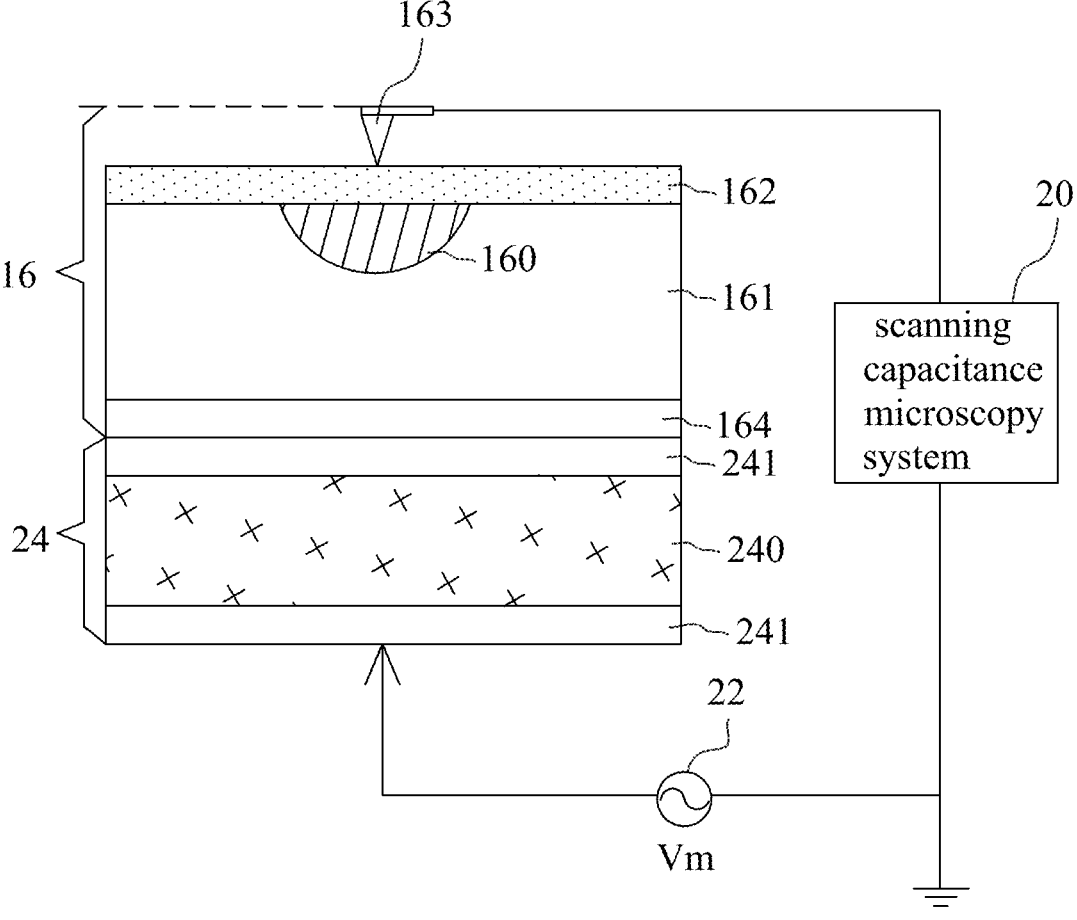
Figure 1C:
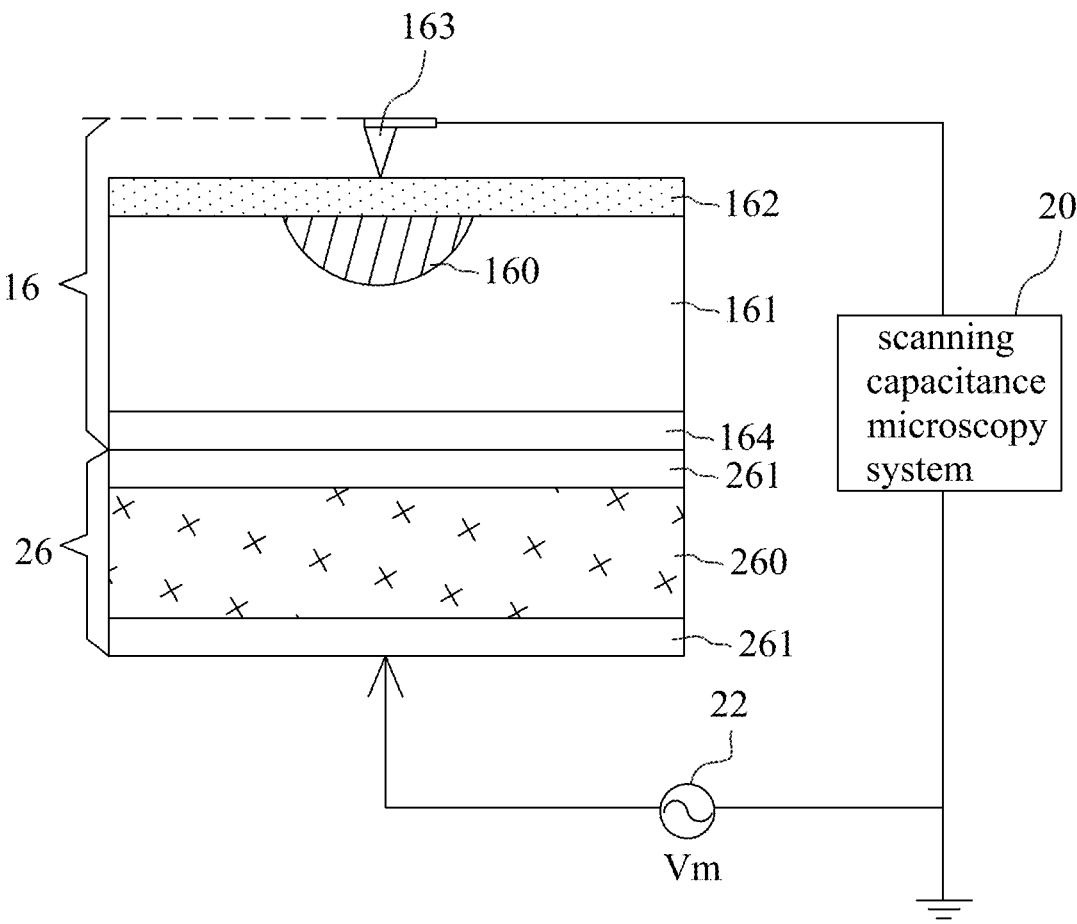

FIGS. 1(a)-1(c) are schematic diagrams illustrating the steps of a method for obtaining the dielectric constant of a dielectric sheet according to an embodiment of the present invention. Referring to FIGS. 1(a)-1(c), the method for obtaining the dielectric constant of a dielectric sheet of the present invention is introduced as follows. As illustrated in FIG. 1(a), a semiconductor capacitor 16 and a first parallel plate capacitor 18 are connected in series, wherein the first dielectric sheet 180 of the first parallel plate capacitor 18 has a known first equivalent physical thickness d1 and a known first dielectric constant ε1 and the semiconductor capacitor 16 has a depletion region 160. The embodiment does not consider the interface defects between the semiconductor capacitor 16 and the first parallel plate capacitor 18. In some embodiments, the semiconductor capacitor 16 may be a metal-oxide-semiconductor capacitor including a semiconductor substrate 161, an oxide layer 162, a conductive probe 163, and an electrode layer 164, but the present invention is not limited thereto. The depletion region 160 is formed in the semiconductor substrate 161. The semiconductor substrate 161 is formed between the oxide layer 162 and the electrode layer 164. The conductive probe 163, touching the oxide layer 162, is electrically connected to a grounding terminal and a scanning capacitance microscopy system 20. The scanning capacitance microscopy system 20 includes an ultra-high frequency capacitance sensor and a lock-in amplifier. The first parallel plate capacitor 18 includes two first touch electrodes 181 and the first dielectric sheet 180 therebetween. The electrode layer 164 touches one of the first touch electrodes 181 to connect the semiconductor capacitor 16 to the first parallel plate capacitor 18 in series. Another of the first touch electrodes 181 is electrically connected to a modulation voltage source 22. The modulation voltage source 22 is configured to generate a modulation voltage Vm. The modulation voltage Vm is an alternating-current (AC) voltage. The first dielectric sheet 180 may include an insulating material such as borosilicate glass, quartz, $ZrO_2$, or sapphire, but the present invention is not limited thereto.

By a scanning capacitance microscopy and the modulation voltage source 22, the modulation voltage Vm is applied to the semiconductor capacitor 16 and the first parallel plate capacitor 18 to periodically change the width of the depletion region 160. In addition, a first scanning capacitance microscopy signal corresponding to the semiconductor capacitor 16 and the first parallel plate capacitor 18 is measured by the scanning capacitance microscopy system 20. The first scanning capacitance microscopy signal has a unit of volt. The first scanning capacitance microscopy signal is directly proportional to the variation of the capacitance divided by the variation of the voltage. The first scanning capacitance microscopy signal is represented with S1. The impedance of the depletion region 160 is represented with Zd. The impedance of the oxide layer 162 is represented with Zox. The impedance of the conductive probe 163 is represented with Zpro. The impedance of the semiconductor substrate 161 is represented with Zsub. The impedance of the electrode layer 164 is represented with Zbc. Zox, Zpro, Zsub, and Zbc are constants. Zd changes with the modulation voltage Vm. As a result, $$S1 = \alpha \left( \frac{Zd}{Zox + Zpro + Zsub + Zbc + Z1} \right) \times Vm = \alpha \times \left( \frac{Zd}{Z' + Z1} \right) \times Vm.$$

α represents a system parameter, Z1 represents an impedance corresponding to the first dielectric sheet 180, and Z'=Zox+Zpro+Zsub+Zbc.

As illustrated in FIG. 1(b), the first parallel plate capacitor 18 is replaced with a second parallel plate capacitor 24 and the semiconductor capacitor 16 and the second parallel plate capacitor 24 are connected in series after measuring the first scanning capacitance microscopy signal. The second dielectric sheet 240 of the second parallel plate capacitor 24 has a known second equivalent physical thickness d2 and a known second dielectric constant 82. The second dielectric sheet 240 and the first dielectric sheet 180 have the same areas. The embodiment does not consider the interface defects of the second parallel plate capacitor 24. The second parallel plate capacitor 24 includes two second touch electrodes 241 and the second dielectric sheet 240 therebetween. The electrode layer 164 touches one of the second touch electrodes 241 to connect the semiconductor capacitor 16 to the second parallel plate capacitor 24 in series. Another of the second touch electrodes 241 is electrically connected to the modulation voltage source 22. The second dielectric sheet 240 may include an insulating material such as borosilicate glass, quartz, $ZrO_2$, or sapphire, but the present invention is not limited thereto.

Then, by the scanning capacitance microscopy and the modulation voltage source 22, the modulation voltage Vm is applied to the semiconductor capacitor 16 and the second parallel plate capacitor 24 to periodically change the width of the depletion region 160. In addition, a second scanning capacitance microscopy signal corresponding to the semiconductor capacitor 16 and the second parallel plate capacitor 24 is measured by the scanning capacitance microscopy system 20. The second scanning capacitance microscopy signal has a unit of volt. The second scanning capacitance microscopy signal is directly proportional to the variation of the capacitance divided by the variation of the voltage. The second scanning capacitance microscopy signal is represented with S2. Zox, Zpro, Zsub, and Zbc are constants and Zd changes with the modulation voltage Vm. As a result, $$S2 = \alpha \left( \frac{Zd}{Z' + Z2} \right) \times Vm.$$

Z2 represents an impedance corresponding to the second dielectric sheet 240.

For the same parallel plate capacitor with a dielectric sheet, its capacitance=the dielectric constant of the dielectric sheet×the area of the dielectric sheet divided by the thickness of the dielectric sheet. Thus, the impedance corresponding to the parallel plate capacitor is directly proportional to the reciprocal of the capacitance of the parallel plate capacitor and also directly proportional to the thickness of the dielectric sheet divided by the dielectric constant of the dielectric sheet. As a result, the capacitance of the first parallel plate capacitor 18 divided by the capacitance of the second parallel plate capacitor 24=a capacitance ratio Rc12=an impedance corresponding to the second parallel plate capacitor 24 divided by an impedance corresponding to the first parallel plate capacitor 18=(d2/ε2)×(ε1/d1)=(d2/d1)×(ε1/ε2).

Accordingly, S2=α×Zd/(Z'+Rc12×Z1)×Vm. According to the foregoing description, the first scanning capacitance microscopy signal S1 divided by the second scanning capacitance microscopy signal S2=a signal ratio Rs12=(Z'+Rc12×Z1)/(Z'+Z1)=1+(Rc12−1)×Z1/(Z1+Z'). In other words, Rs12=[Z1/(Z1+Z')]Rc12+[1−Z1/(Z1+Z')].

An impedance ratio ZR is calculated based on the first scanning capacitance microscopy signal S1, the second scanning capacitance microscopy signal S2, and (d2/d1)×(ε1/ε2). Since Rs12=[Z1/(Z1+Z')]Rc12+[1−Z1/(Z1+Z')] and Rs12 and Rc12 are known, Z1/(Z1+Z') is obtained and defined as ZR. That is to say, the impedance ratio ZR=an impedance corresponding to the first dielectric sheet 180 divided by (an impedance corresponding to the semiconductor capacitor 16+an impedance corresponding to the first dielectric sheet 180). Thus, $$S1/S2 = ZR \times (d2/d1) \times (\varepsilon1/\varepsilon2) + (1 - ZR).$$

As illustrated in FIG. 1(c), the second parallel plate capacitor 24 is replaced with a third parallel plate capacitor 26 and the semiconductor capacitor 16 and the third parallel plate capacitor 26 are connected in series after obtaining the impedance ratio ZR. The third dielectric sheet 260 of the third parallel plate capacitor 26 has a known third equivalent physical thickness d3. The first dielectric sheet 180 and the third dielectric sheet 260 have the same areas. The embodiment does not consider the interface defects of the third parallel plate capacitor 26. The third parallel plate capacitor 26 includes two third touch electrodes 261 and the third dielectric sheet 260 therebetween. The third touch electrodes 261, the second touch electrodes 241, and the first touch electrodes 181 include the same material. The third touch electrodes 261, the second touch electrodes 241, and the first touch electrodes 181 are formed using the same fabrication scanning capacitance microscopy signal is represented with S3. Zox, Zpro, Zsub, and Zbc are constants and Zd changes with the modulation voltage Vm. As a result, $$S3 = \alpha \left( \frac{Zd}{Z' + Z3} \right) \times Vm.$$

Z3 represents an impedance corresponding to the third dielectric sheet 260.

Finally, the third dielectric constant 83 of the third dielectric sheet 260 of the third parallel plate capacitor 26 based on the first scanning capacitance microscopy signal S1, the third scanning capacitance microscopy signal S3, the third equivalent physical thickness d3, and the impedance ratio ZR. S1/S2=ZR×(d2/d1)×(ε1/ε2)+(1−ZR). Analogously, the first scanning capacitance microscopy signal S1 divided by the third scanning capacitance microscopy signal S3=a signal ratio Rs13=S1/S3=ZR×(d3/d1)×(ε1/ε3)+(1−ZR). The capacitance of the first parallel plate capacitor 18 divided by the capacitance of the third parallel plate capacitor 26=a capacitance ratio Rc13=an impedance corresponding to the third parallel plate capacitor 26 divided by an impedance corresponding to the first parallel plate capacitor 18=(d3/d1)×(ε1/ε3). Since S1, S3, d3, ε1, and ZR are known, the third dielectric constant ε3 is obtained.

FIGS. 2-8 are diagrams illustrating the curves of the signal ratio and the capacitance ratio of a dielectric sheet according to various embodiments of the present invention. The experimental results used by the method for obtaining the dielectric constant of the dielectric sheet of the present invention are introduced as follows. Table 1 shows the symbol, material and equivalent physical thickness of the dielectric sheet of the parallel plate capacitor used in the experimental setup.

TABLE 1

| symbol | Q1 | Q2 | Q3 | Q4 | Q5 | G1 | Zr1 |
|---|---|---|---|---|---|---|---|
| material | quartz | quartz | quartz | quartz | quartz | borosilicate glass | ZrO₂ |
| equivalent physical thickness | 67 μm | 64 μm | 55 μm | 60 μm | 58 μm | 135 μm | 500 μm | process. The electrode layer 164 touches one of the third touch electrodes 261 to connect the semiconductor capacitor 16 to the third parallel plate capacitor 26 in series. Another of the third touch electrodes 261 is electrically connected to the modulation voltage source 22. The third dielectric sheet 260 may include an insulating material such as borosilicate glass, quartz, ZrO₂, or sapphire, but the present invention is not limited thereto.

Figures 2, 3:
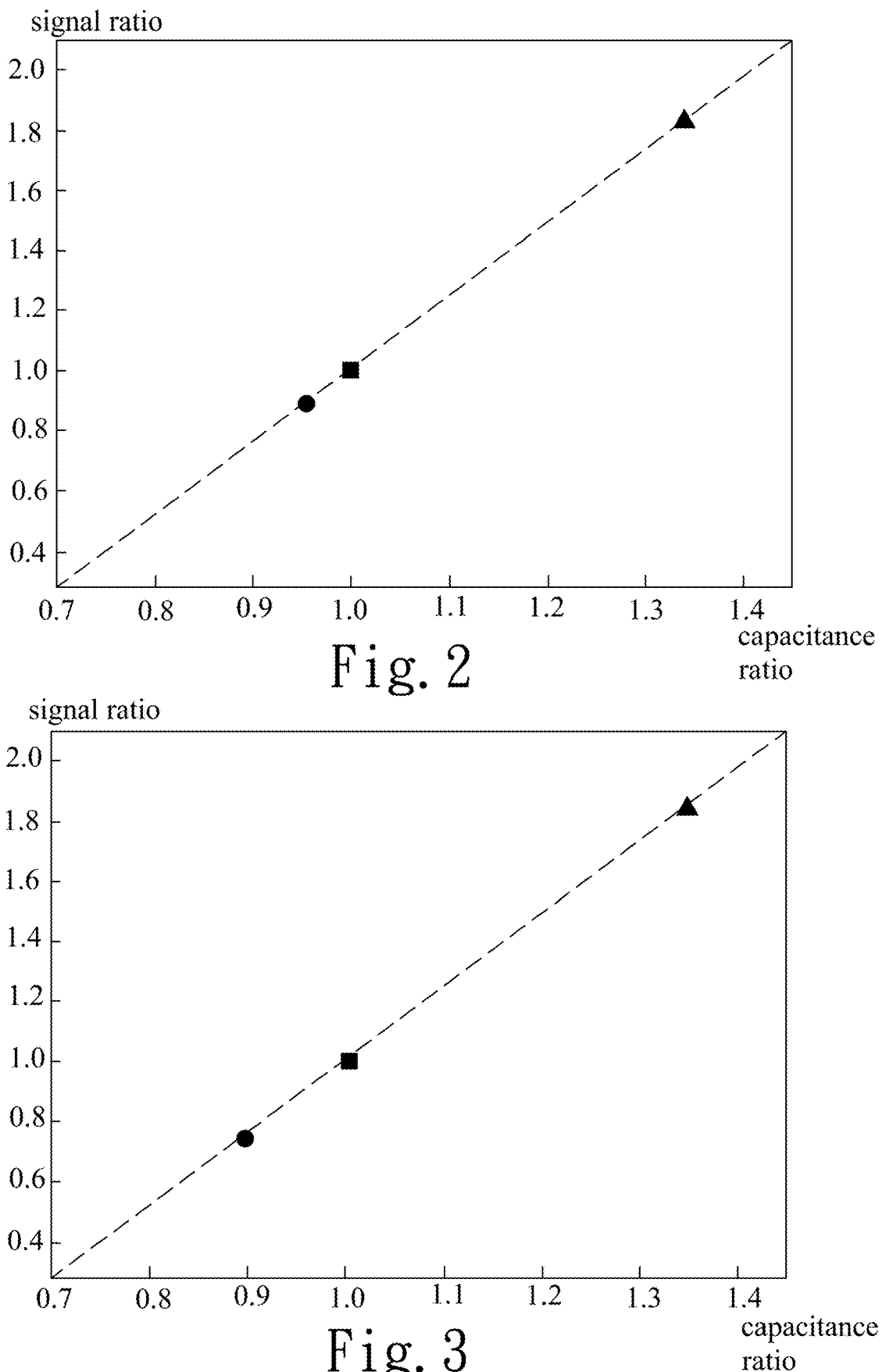
FIGS. 2-8 are diagrams illustrating the curves of the signal ratio and the capacitance ratio of a dielectric sheet according to various embodiments of the present invention.

Then, by the scanning capacitance microscopy and the modulation voltage source 22, the modulation voltage Vm is applied to the semiconductor capacitor 16 and the third parallel plate capacitor 26 to periodically change the width of the depletion region 160. A third scanning capacitance microscopy signal corresponding to the semiconductor capacitor 16 and the third parallel plate capacitor 26 is measured by the scanning capacitance microscopy system 20. The third scanning capacitance microscopy signal has a unit of volt. The third scanning capacitance microscopy signal is directly proportional to the variation of the capacitance divided by the variation of the voltage. The third FIG. 2 shows squares that represent data corresponding to Q1 as the dielectric sheet of the first parallel plate capacitor. Each of the capacitance ratio and the signal ratio of the scanning capacitance microscopy signal corresponding to Q1 is defined as 1. FIG. 2 shows circles that represent data corresponding to Q2 as the dielectric sheet of the second parallel plate capacitor. FIG. 2 shows triangles that represent data corresponding to G1 as the dielectric sheet of the third parallel plate capacitor. FIG. 2 shows a dashed line illustrated based on Rs12=[Z1/(Z1+Z')]Rc12+[1−Z1/(Z1+Z')]. In the experimental setup, it is found that the data corresponding to G1 are still on the dashed line, thus proving the feasibility of the method for obtaining the dielectric constant of the dielectric sheet of the present invention.

FIG. 3 shows squares that represent data corresponding to Q1 as the dielectric sheet of the first parallel plate capacitor. Each of the capacitance ratio and the signal ratio of the scanning capacitance microscopy signal corresponding to Q1 is defined as 1. FIG. 3 shows circles that represent data corresponding to Q4 as the dielectric sheet of the second parallel plate capacitor. FIG. 3 shows triangles that represent data corresponding to G1 as the dielectric sheet of the third parallel plate capacitor. FIG. 3 shows a dashed line illustrated based on $Rs12=[Z1/(Z1+Z')]Rc12+[1-Z1/(Z1+Z')]$. In the experimental setup, it is found that the data corresponding to G1 are still on the dashed line, thus proving the feasibility of the method for obtaining the dielectric constant of the dielectric sheet of the present invention.

Figures 4, 5:
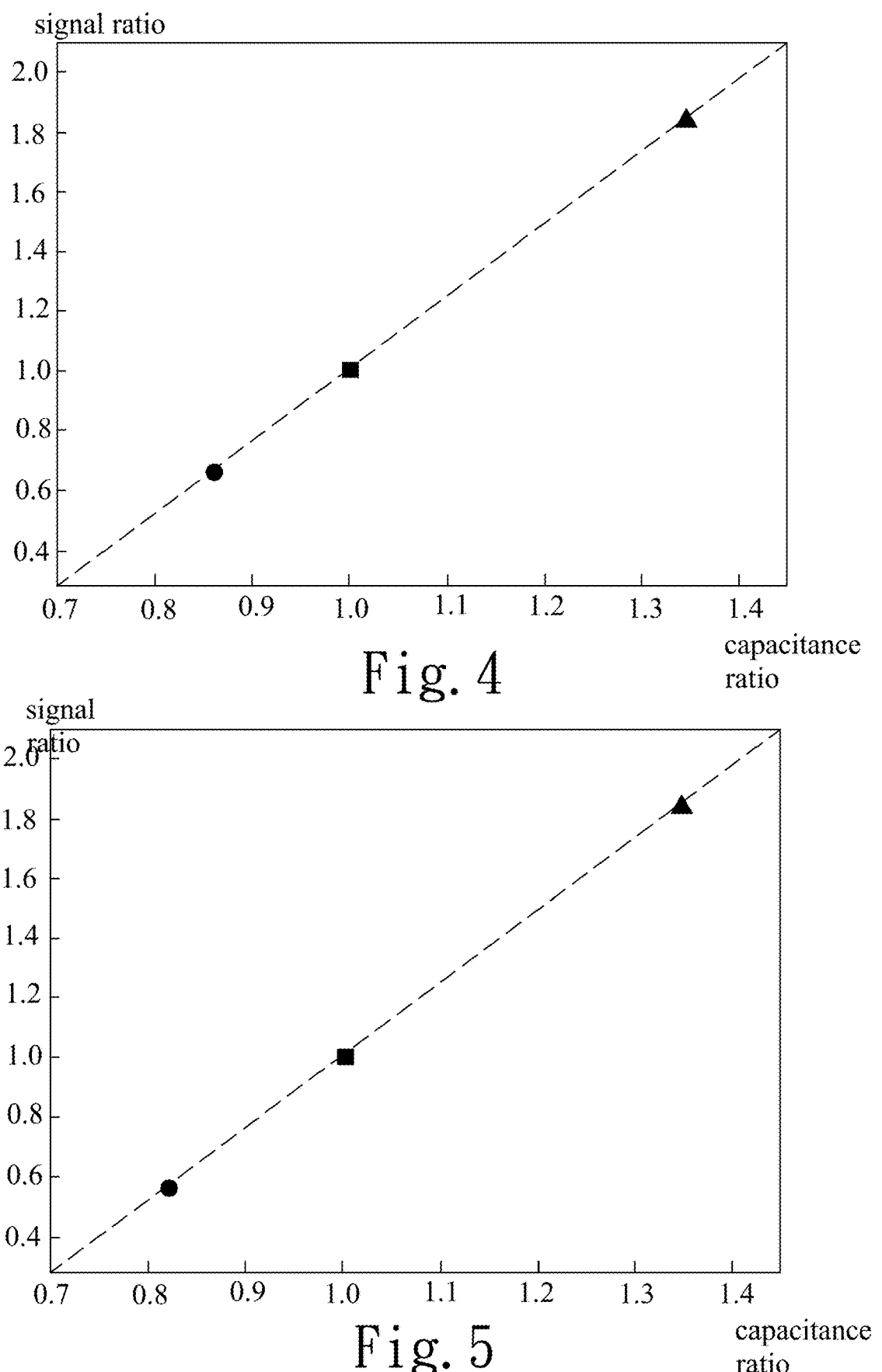

FIG. 4 shows squares that represent data corresponding to Q1 as the dielectric sheet of the first parallel plate capacitor. Each of the capacitance ratio and the signal ratio of the scanning capacitance microscopy signal corresponding to Q1 is defined as 1. FIG. 4 shows circles that represent data corresponding to Q5 as the dielectric sheet of the second parallel plate capacitor. FIG. 4 shows triangles that represent data corresponding to G1 as the dielectric sheet of the third parallel plate capacitor. FIG. 3 shows a dashed line illustrated based on $Rs12=[Z1/(Z1+Z')]Rc12+[1-Z1/(Z1+Z')]$. In the experimental setup, it is found that the data corresponding to G1 are still on the dashed line, thus proving the feasibility of the method for obtaining the dielectric constant of the dielectric sheet of the present invention.

FIG. 5 shows squares that represent data corresponding to Q1 as the dielectric sheet of the first parallel plate capacitor. Each of the capacitance ratio and the signal ratio of the scanning capacitance microscopy signal corresponding to Q1 is defined as 1. FIG. 5 shows circles that represent data corresponding to Q3 as the dielectric sheet of the second parallel plate capacitor. FIG. 5 shows triangles that represent data corresponding to G1 as the dielectric sheet of the third parallel plate capacitor. FIG. 5 shows a dashed line illustrated based on $Rs12=[Z1/(Z1+Z')]Rc12+[1-Z1/(Z1+Z')]$. In the experimental setup, it is found that the data corresponding to G1 are still on the dashed line, thus proving the feasibility of the method for obtaining the dielectric constant of the dielectric sheet of the present invention.

Figure 6:
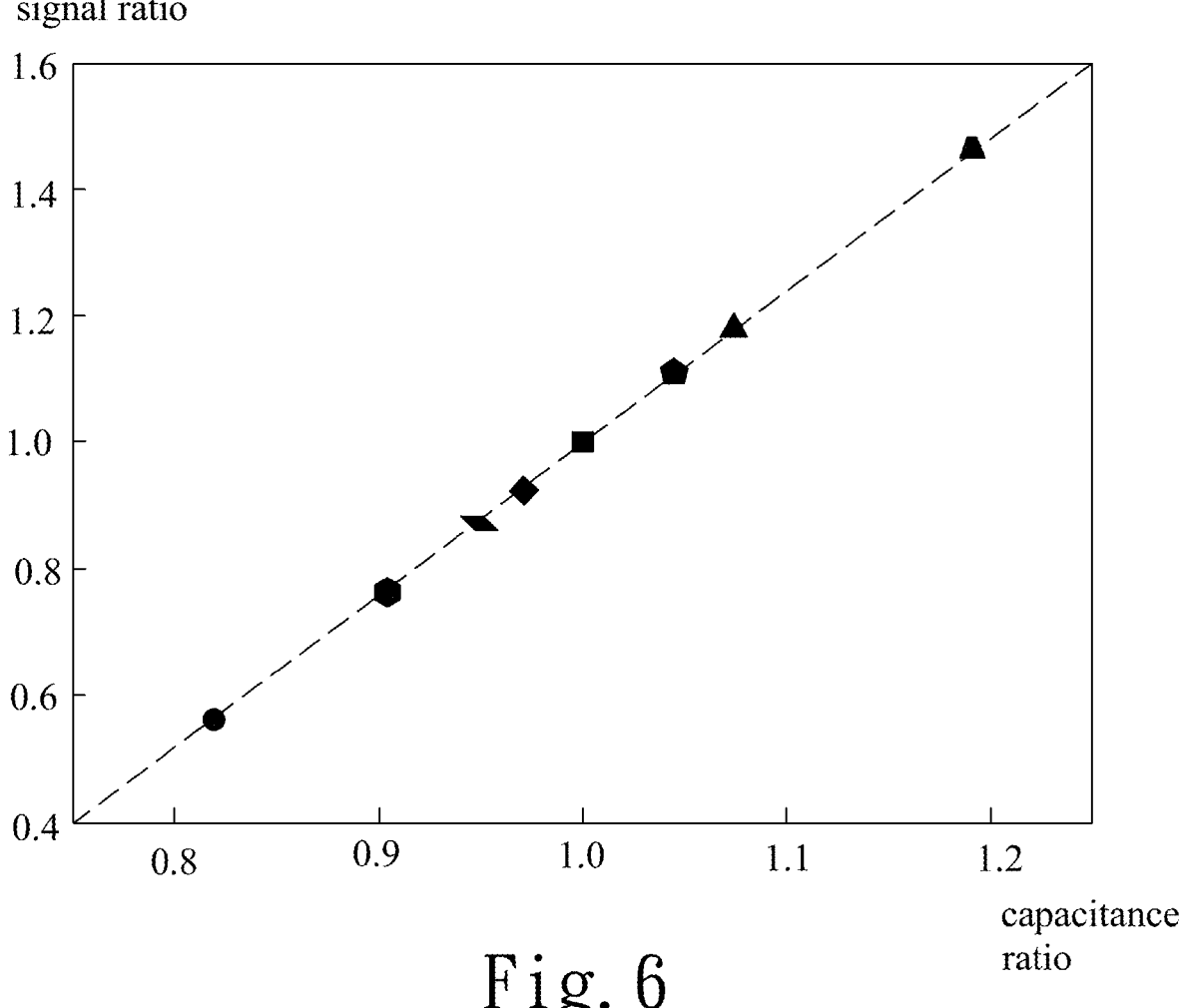

FIG. 6 shows squares that represent data corresponding to Q1 as the dielectric sheet of the first parallel plate capacitor. Each of the capacitance ratio and the signal ratio of the scanning capacitance microscopy signal corresponding to Q1 is defined as 1. FIG. 6 shows circles that represent data corresponding to Q5 as the dielectric sheet of the second parallel plate capacitor. FIG. 6 shows rhombuses, parallelograms, hexagons, triangles, pentagons, and trapezoids that represent data corresponding to Q5 as the dielectric sheet of the third parallel plate capacitor after microwave annealing (MWA). FIG. 6 shows squares and circles that represent data before MWA. FIG. 6 shows a dashed line illustrated based on $Rs12=[Z1/(Z1+Z')]Rc12+[1-Z1/(Z1+Z')]$. In the experimental setup, it is found that the data corresponding to rhombuses, parallelograms, hexagons, triangles, pentagons, and trapezoids are still on the dashed line, thus proving the feasibility of the method for obtaining the dielectric constant of the dielectric sheet of the present invention. Table 2 shows that circle data, rhombus data, parallelogram data, hexagon data, triangle data, pentagon data, and trapezoid data respectively correspond to microwave annealing time, microwave annealing times and dielectric constant.

TABLE 2

| data | microwave annealing time | microwave annealing times | dielectric constant |
|------|------|------|------|
| circle | 0 s | 0 | 4.50 |
| rhombus | 30 s | 1 | 4.63 |

TABLE 2-continued

| data | microwave annealing time | microwave annealing times | dielectric constant |
|------|------|------|------|
| parallelogram | 30 s | 2 | 4.74 |
| hexagon | 30 s | 3 | 4.98 |
| triangle | 30 s | 4 | 4.19 |
| pentagon | 60 s | 1 | 4.31 |
| trapezoid | 60 s | 2 | 3.79 |

Figures 7, 8:
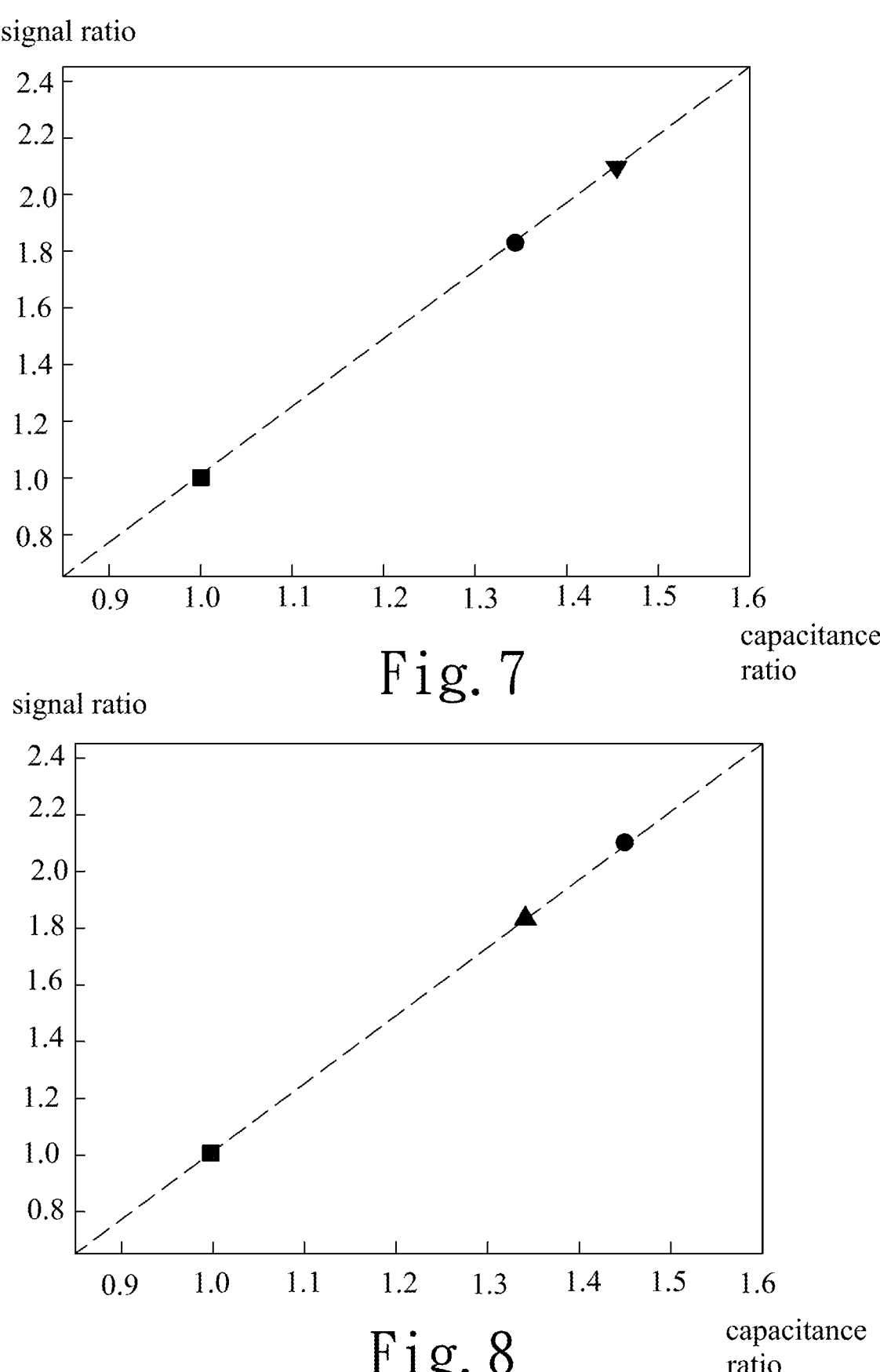

FIG. 7 shows squares that represent data corresponding to Q1 as the dielectric sheet of the first parallel plate capacitor. Each of the capacitance ratio and the signal ratio of the scanning capacitance microscopy signal corresponding to Q1 is defined as 1. FIG. 7 shows circles that represent data corresponding to G1 as the dielectric sheet of the second parallel plate capacitor. FIG. 7 shows triangles that represent data corresponding to Zr1 as the dielectric sheet of the third parallel plate capacitor. FIG. 7 shows a dashed line illustrated based on $Rs12= [Z1/(Z1+Z')]Rc12+[1-Z1/(Z1+Z')]$. In the experimental setup, it is found that the data corresponding to Zr1 are still on the dashed line, thus proving the feasibility of the method for obtaining the dielectric constant of the dielectric sheet of the present invention.

FIG. 8 shows squares that represent data corresponding to Q1 as the dielectric sheet of the first parallel plate capacitor. Each of the capacitance ratio and the signal ratio of the scanning capacitance microscopy signal corresponding to Zr1 is defined as 1. FIG. 8 shows circles that represent data corresponding to G1 as the dielectric sheet of the second parallel plate capacitor. FIG. 8 shows triangles that represent data corresponding to Zr1 as the dielectric sheet of the third parallel plate capacitor. FIG. 8 shows a dashed line illustrated based on $Rs12=[Z1/(Z1+Z')]Rc12+[1-Z1/(Z1+Z')]$. In the experimental setup, it is found that the data corresponding to G1 are still on the dashed line, thus proving the feasibility of the method for obtaining the dielectric constant of the dielectric sheet of the present invention.

According to the embodiments provided above, the method for obtaining the dielectric constant of the dielectric sheet employs the three known equivalent physical thicknesses and the impedance ratio to calculate the dielectric constant of the dielectric sheet of the parallel plate capacitor to be measured, thereby solving the problem with measurement errors caused by changes in the shape of the dielectric sheet due to undulations on the surface of the material or internal voids. The method extends the scanning capacitance microscopy to the field of measuring the dielectric constant of dielectric sheets to enhance the capabilities of scanning capacitance microscopy in the related applications.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A method for obtaining the dielectric constant of a dielectric sheet comprising:

connecting a semiconductor capacitor and a first parallel plate capacitor in series, wherein a first dielectric sheet of the first parallel plate capacitor has a known first equivalent physical thickness d1 and a known first dielectric constant ε1 and the semiconductor capacitor has a depletion region;

by a scanning capacitance microscopy, applying a modulation voltage to the semiconductor capacitor and the first parallel plate capacitor to periodically change a width of the depletion region and measuring a first scanning capacitance microscopy signal corresponding to the semiconductor capacitor and the first parallel plate capacitor;

replacing the first parallel plate capacitor with a second parallel plate capacitor and connecting the semiconductor capacitor and the second parallel plate capacitor in series, wherein a second dielectric sheet of the second parallel plate capacitor has a known second equivalent physical thickness d2 and a known second dielectric constant ε2;

by the scanning capacitance microscopy, applying the modulation voltage to the semiconductor capacitor and the second parallel plate capacitor to periodically change a width of the depletion region and measuring a second scanning capacitance microscopy signal corresponding to the semiconductor capacitor and the second parallel plate capacitor;

calculating an impedance ratio based on the first scanning capacitance microscopy signal, the second scanning capacitance microscopy signal, and (d2/d1)×(ε1/ε2);

replacing the second parallel plate capacitor with a third parallel plate capacitor and connecting the semiconductor capacitor and the third parallel plate capacitor in series, wherein a third dielectric sheet of the third parallel plate capacitor has a known third equivalent physical thickness d3 and the first dielectric sheet, the second dielectric sheet, and the third dielectric sheet have the same areas;

by the scanning capacitance microscopy, applying the modulation voltage to the semiconductor capacitor and the third parallel plate capacitor to periodically change a width of the depletion region and measuring a third scanning capacitance microscopy signal corresponding to the semiconductor capacitor and the third parallel plate capacitor; and obtaining a third dielectric constant of the third dielectric sheet of the third parallel plate capacitor based on the first scanning capacitance microscopy signal, the third scanning capacitance microscopy signal, the third equivalent physical thickness, and the impedance ratio.

2. The method for obtaining the dielectric constant of a dielectric sheet according to claim 1, wherein the semiconductor capacitor is a metal-oxide-semiconductor capacitor.

3. The method for obtaining the dielectric constant of a dielectric sheet according to claim 1, wherein the semiconductor capacitor further comprises a conductive probe that is electrically grounded.

4. The method for obtaining the dielectric constant of a dielectric sheet according to claim 1, wherein the first dielectric sheet, the second dielectric sheet, and the third dielectric sheet comprise an insulating material.

5. The method for obtaining the dielectric constant of a dielectric sheet according to claim 1, wherein the first scanning capacitance microscopy signal, the second scanning capacitance microscopy signal, the first equivalent physical thickness, the second equivalent physical thickness, and the impedance ratio meet a following equation:

$S1/S2=ZR\times(d2/d1)\times(\varepsilon1/\varepsilon2)+(1-ZR)$, where S1 represents the first scanning capacitance microscopy signal, S2 represents the second scanning capacitance microscopy signal, and ZR represent the impedance ratio.

6. The method for obtaining the dielectric constant of a dielectric sheet according to claim 5, wherein the first scanning capacitance microscopy signal, the third scanning capacitance microscopy signal, the first equivalent physical thickness, the third equivalent physical thickness, and the impedance ratio meet a following equation:

$S1/S3=ZR\times(d3/d1)\times(\varepsilon1/\varepsilon3)+(1-ZR)$, where S1 represents the first scanning capacitance microscopy signal, S3 represents the third scanning capacitance microscopy signal, ZR represent the impedance ratio, and ε3 represents the third dielectric constant.

7. The method for obtaining the dielectric constant of a dielectric sheet according to claim 5, wherein the impedance ratio=an impedance corresponding to the first dielectric sheet divided by (an impedance corresponding to the semiconductor capacitor+the impedance corresponding to the first dielectric sheet).

* * * * *